(12) United States Patent
Sutter et al.

(10) Patent No.: US 6,468,647 B1
(45) Date of Patent: Oct. 22, 2002

(54) INFRARED REFLECTIVE VISUALLY COLORED METALLIC COMPOSITIONS

(75) Inventors: Christopher Richard Sutter, Newton; Richard August Petelinkar, Hickory; Rebecca Edythe Reeves, Conover, all of NC (US)

(73) Assignee: Spectro Dynamic Systems, LLC, Erwin, TN (US)

( * ) Notice: Subject to any disclaimer, the term of this patent is extended or adjusted under 35 U.S.C. 154(b) by 0 days.

(21) Appl. No.: 09/035,535

(22) Filed: Feb. 17, 1998

(51) Int. Cl.$^7$ .................. B32B 18/00; H05K 9/00; H05K 17/00
(52) U.S. Cl. ............... 428/325; 428/328; 428/331; 428/559; 174/35 MS
(58) Field of Search .................. 428/546, 553, 428/558, 559, 325, 331, 328, 323, 403; 174/35 MS; 29/89.5; 342/1, 2, 3; 250/505.1

(56) References Cited

U.S. PATENT DOCUMENTS

| | | | | |
|---|---|---|---|---|
| 661,650 A | * | 11/1900 | Thurston | 428/546 |
| 3,023,127 A | * | 2/1962 | Clayton | 427/242 |
| 3,540,862 A | * | 11/1970 | Roemer | 428/208 |
| 5,389,434 A | * | 2/1995 | Chamberlain et al. | 428/323 |
| 5,506,053 A | * | 4/1996 | Hubbard | 428/402 |
| 5,786,785 A | * | 7/1998 | Gindrup et al. | 342/1 |

* cited by examiner

*Primary Examiner*—Blaine Copenheaver
*Assistant Examiner*—John J Guarriello

(57) ABSTRACT

Infrared reflective visually colored metal substrates or metal-coated particles are prepared by burnishing colored pigments into the metal. Proper selection of the pigment allows for intense visual color without degradation of the infrared reflective properties. The resulting visually colored infrared reflective composition may be utilized in a variety of applications, such as coatings, fabrics, tapes, and face paint, to provide infrared signature control as well as visual camouflage.

14 Claims, No Drawings

INFRARED REFLECTIVE VISUALLY COLORED METALLIC COMPOSITIONS

BACKGROUND

The recent proliferation of inexpensive infrared imaging systems for battlefield detection and targeting has created a new threat for the US Armed Forces. These imaging systems, often referred to as FLIRs (forward looking infrared), can operate in wavelengths from 1 to 20 microns with sensitivities of a few tenths of a degree centigrade. They operate by detecting the contrast of infrared radiation between a target and its background, principally in the 3–5 and 8–12 micron regions. Engines, generators, and other heat producing devices are readily visible to an infrared detector. Thermal radiation to areas surrounding the engine, generator, or heat producing device also enhances the ease of detection, since the apparent size of the heated surface increases considerably. Other effects, such as solar loading and friction lead to surface temperatures higher than the background. Human skin also emits more radiation than the typical background, making military personnel and their war machines more easily detectable with infrared devices. A need exists for defeating these IR imaging systems by making it difficult for the device to discriminate between the potential target object and its background. In addition, since the human eye remains the most sensitive instrument for detecting objects in the visual region (0.3–0.7 microns) and electro-optic sensors are available to discriminate colors, the need also exists for defeating these IR imaging devices without detracting from conventional visual camouflage.

The ability of a material to emit infrared radiation is called its emissivity. Two materials at the same thermal temperature but with one having a high emissivity and one having a low emissivity will not radiate the same amount of infrared energy. The high emissivity material will radiate strongly while the low emissivity material will radiate very little. A thermally warm object can be made to appear cooler to a FLIR if its surface is made reflective to background infrared radiation by use of a low emissivity material. The relationship between emissivity and reflectivity for infrared radiation is that low emissivity materials tend to be highly reflective and that high emissivity materials tend to be very poorly reflective. Emissivity is a fundamental property of the electron mobility found in the material. Thus, a good electrical conductor, such as a metal, with high electron mobility has a low emissivity and is very reflective. A poor electrical conductor, such as glass or organic materials, has little electron mobility, is a very poor reflector, and has a high emissivity. In general, the sky and surrounding environment are thermally much cooler than the object to be camouflaged in the infrared. A reflective surface will reflect into the FLIR the lower level of radiation coming from the sky and the surrounding environment, masking the temperature of the object by making it appear to be thermally cooler.

The formulation of a practical coating suitable for both infrared and visible camouflage is difficult to achieve with available materials. Many metallic pigments such as aluminum, metallized mica flakes or other finely powdered metals can be incorporated as pigments into paints to achieve various levels of infrared reflectivity. The influence on the final coating emissivity from the individual component is dependent on the amount of metallic pigment included in the coating. Incorporation of high levels of low emissivity pigments to create a low emissivity coating lead to poor coating physical properties incapable of withstanding the rigors of combat deployment. As all metallic pigmented coatings appear to the eye as off-white to gray in color, further addition of high emissivity visual pigments to allow visual camouflage coatings both increase the coating emissivity and decrease the coating physical properties. The requirement for combined visual and infrared camouflage for aircraft, armor, and soldiers cannot presently be met with conventional coating materials.

Metallized cenospheres as taught in U.S. Pat. No. 4,624,798 are an unconventional type of highly effective pigment material. These unique materials enable preparation of compositions with high IR reflectivity. The size and shape of the spheres allow for low emissive coatings without high pigment loadings and subsequent loss of the coating physical properties. In addition, the diffuse spheres integrate the infrared radiation from the background to provide an apparent infrared match with the surroundings. Due to the spherical shape, a uniform surface area is presented in a coating, providing greater influence on the emissivity of the final coating.

SUMMARY OF THE INVENTION

I have discovered a novel technique to incorporate color on metallic surfaces in a way which does not appreciably interfere with their ability to control infrared reflectivity. Many commercially available pigments can be burnished into a metallic surface to yield a modified surface which retains the color of the pigment, and in addition still retains very high infrared reflectivity and low emissivity. (NOTE: I use the word "burnish" in this application to refer to an impregnation process in which pigment particles are mechanically forced into a metallic surface by abrasive and impact methods.) This burnished surface technique holds the pigment particles so strongly that the pigment cannot be removed by normal washing or by solvents. The amount of pigment burnished into the surface may be varied to achieve various color saturations. All commercially available pigments are not suitable for burnishing. Important attributes for those pigments that perform well include the hardness of the pigment particles and a dispersed particle size of less than 1 micron.

I have shown that colored pigment particles, less than 1 micron in size and mechanically attached to a metallic surface by burnishing, produce colored materials that retain excellent infrared reflective properties. The colored pigment particle, with dimensions much smaller than the wavelength of the infrared radiation, affects the infrared reflectivity of the metallic substrate only slightly. At the same time, the dimensions of the pigment particle attached to the metallic surface are similar to or larger than visible wavelengths and allow a strong contribution to the visual color.

Metallic sheets, which may consist of metal plate or a metal plated substrate, may readily be colored to produce a low emissivity surface having the selected hue. The method consists of grinding or burnishing the pigment onto the surface with a burnishing tool, which may be hand powered or machine powered, and removing any excess pigment.

Burnishing of metal particles or metal-coated particles with colored pigments can be accomplished by several techniques. The preferred technique is to place the metallic particles in a vibratory tumbler with an appropriate amount of colored pigment, and vibrate the mixture from one-half to four hours. The rubbing and grinding motions in the vibratory tumbler enable the pigment to be burnished into the metallic surface. The mixture is then sieved to separate the products, and the resulting controlled reflectivity color particles can be utilized directly in a coating formulation which can be applied to metal, plastic, composite, or fabric substrates to yield products which have the desired infrared reflectivity and the desired visual color. Another technique is to tumble the metallic particles with the pigment and a larger grinding media in a conventional ball mill for a period up to 18 hours. This method requires screening and washing of the final product. The color saturation of the resulting metallic particles can readily be varied by the length of burnishing time and by the amount of pigment used. The pigment particles are mechanically bound to the surface of the metal and are not easily removable by washing or handling. The pigment particles remain on the metallic surface when the colored particles are utilized in coating formulations.

The preferred method of producing colored highly reflective infrared pigments is accomplished by using a vibratory tumbler similar to the Ultra-Vibe 18 or Ultra-Vibe 45 manufactured by Tru Square Metal Products, Auburn, Wash. The tumbler is charged with the metallic or metal-coated particles to be colored. Colored pigment is added and the tumbler is operated for ½–12 hours. After the prescribed time, the particles are emptied onto a 100–150 micron screen and the colored metallic particles are sieved to remove clumped and very fine material.

To evaluate the infrared properties, reflectivity and emissivity measurements were performed using an Inframetrics 760 Reflectometer at normal incidence. Neat pigment measurements were performed in the following manner:

A 12"×12"×¼" aluminum plate was placed on the surface of a 12"×12" flat hotplate heated to 100° C. One 6" square corner of the aluminum plate was painted black to represent a high emissivity material, approximately 0.95. The rest of the plate was polished aluminum to represent a low emissivity material, approximately 0.09. The pigment to be measured was placed in a 3" diameter aluminum weighing dish filled to a uniform height of ⅛" and completely covering the bottom surface of the dish. The dish was placed on the polished aluminum panel for 15 minutes to achieve thermal equilibrium. The Inframetrics 760 was then used to measure the apparent temperatures of the three different materials. The apparent temperature of the sample could then be converted to emissivity.

Measurements were similarly performed on applied coatings by placing a 6"×6"×⅛" aluminum panel coated with an infrared reflective composition incorporating materials produced by the method described above onto the 12"×12"×¼" aluminum plate situated on the hot plate. The coated aluminum panel was allowed to thermally equilibrate with the heated hot plate for 15 minutes. The Inframetrics 760 was then used to measure the emissivity of the coated panel as described above.

PREPARATION OF INFRARED REFLECTIVE VISUALLY COLORED METAL SUBSTRATES OR

METAL COATED PARTICLES AND COMPOSITIONS INCORPORATING SAME

EXAMPLES

Literature from pigment manufacturers generally does not disclose sufficient information to determine the suitability of a pigment for burnishing into metals. The method utilized to determine the suitability of each pigment is simple and quick.

A small amount of the pigment to be tested is placed on a clean polished copper or aluminum plate. The pigment is rubbed into the metal surface with progressively harder utensils, typically a gloved finger first, followed by a rubber stopper, followed by a wooden block, and last by a glass block. After each rubbing, the excess powder is pushed to the side and the adhesion of the pigment to the plate is tested by rubbing with a cotton rag. The amount of pigment strongly adhering to the surface can readily be determined by the visual color of the burnished area. Those pigments that adhere well when burnished by the softer instruments during this test generally perform well in the production of the material which is the subject of this invention.

PREPARATION OF INFRARED REFLECTIVE VISUALLY COLORED METAL COATED PARTICLES

The first two examples which follow below demonstrate the general technique for burnishing hollow ceramic cenospheres coated with silver metal. These cenospheres have an isostatic strength of 4000 psi, although point to point contact can cause breakage. For hollow cenospheres, the preferred method involves the use of an additional grinding media, in this case solid glass spheres. The glass spheres help dissipate the point to point contact forces as well as embed the pigment into the silver metal surface. The utility of the invention allows adjusting the burnishing technique to comply with the substrate requirements.

EXAMPLE 1

A one-gallon can was charged with 300 grams of silver-coated cenospheres which had been manufactured by Spectro Dynamic Systems, Hickory, N.C. (SDS), via methods described in U.S. Pat. No. 4,624,865. Then, 45 grams of F-6331 Black obtained from the Ferro Corporation, a spinel-type pigment based on iron, manganese, and copper oxides, and 1400 grams of 0.3 mm solid glass beads grinding media were added. The gallon can lid was attached, the sealed can lightly shaken by hand to mix well, and then the can was attached to a variable speed tumbler and tumbled end over end at approximately 57 rpm for 3 hours. The resultant dark powder was screened through a 150 micron screen to remove the grinding media. The remaining powder was then transferred to a 6 liter separatory funnel containing about 500 ml of tap water and 10 ml of Tergitol NP9 surfactant from Union Carbide. More tap water was then added to the funnel until it was approximately ¾ full. The mixture was well shaken and allowed to stand for 1½ hours. The burnished hollow cenospheres were allowed to float to the surface and the aqueous phase containing the remaining pigment and any broken cenospheres was drained. This procedure was repeated using acetone as the solvent, then again repeated with water until the solution was clear, indicating that no further pigment could be readily removed from the burnished cenosphere surface. The burnished cenospheres were then filtered and dried. This resulted in producing 250 to 270 grams of dark gray-black hollow cenospheres which had an emissivity of 0.35, measured neat. The unburnished silver coated cenospheres typically exhibit emissivity of 0.30.

EXAMPLE 2

This example is similar to Example 1, except the black pigment utilized was a high purity cosmetic-grade black iron oxide from Harcross. The results were essentially the same, yielding medium gray-black hollow cenospheres having an emissivity near 0.35 neat.

The following two examples indicate the utility of this invention when applied to metals other than silver which have been coated onto hollow cenospheres.

EXAMPLE 3

A one quart can was charged with 12.6 grams of 45 micron particle size nickel coated cenospheres manufactured by SDS, 4.3 grams of Copper Phthalocyanine Blue pigment from Sun Chemical, and 839.1 grams 0.3 mm glass beads grinding media. The mixture was tumbled as in Example 1 for three hours at 57 rpm, and the resulting material screened to remove the grinding media. The remaining product was treated in a separatory funnel first with acetone, and then rinsed with water as in Example 1. This yielded 14.64 grams of a dark blue powder having an emissivity of 0.60 neat, compared to the original nickel coated cenospheres with an emissivity of 0.58.

EXAMPLE 4

In a one quart can, 50.1 grams of 45 micron particle size cobalt coated cenospheres manufactured by SDS, 5 grams Copper Phthalocyanine Blue pigment, and 206 grams 0.3 mm glass beads grinding media were tumbled as in Example 3 to yield 50.68 grams of very dark blue powder, having an emissivity of 0.60. The original cobalt coated cenospheres had an emissivity of 0.45.

The higher product yields from Examples 3 and 4 compared to Examples 1 and 2 was traced to the use of higher ratios of the solid glass grinding media per hollow cenospheres. A ratio of 8–10:1 is preferred to minimize the point to point contact forces during the burnishing process. The color intensity of the resultant burnished product appears independent of grinding media ratio, dependant only on the properties of the pigment.

The next three examples demonstrate the ability of the invention to burnish metals coated onto solid glass spheres. The same technique as Examples 1–4 of additional grinding media was utilized.

EXAMPLE 5

A one quart can was charged with 70.2 grams of silvered solid glass spheres purchased from Potter's Industries (Product Grade #S3000S2, 5–45 microns and 8% silver by weight), 3.6 grams of Copper Phthalocyanine Blue pigment, and 211.2 grams of 0.3 mm glass beads grinding media. This mixture was tumbled for three hours at 57 rpm and the resulting product sieved and washed as in Example 3. This resulted in 71.37 grams of burnished blue powder, having an emissivity of 0.37. The original Potter's material had an emissivity of 0.39.

EXAMPLE 6

A one quart can was charged with 100.1 grams of S3000S2 silver-coated solid glass spheres, 15 grams of F-6113 Ferro black pigment, and 145.7 grams of 0.3 mm glass beads grinding media. The mixture was tumbled 3 hours at 57 rpm, then sieved and washed as in Example 3. This yielded 111.6 grams of burnished black powder having an emissivity of 0.41. The original material had an emissivity of 0.39.

EXAMPLE 7

A one quart can was charged with 52.4 grams S3000S2 silver-coated solid glass spheres, 2.7 grams of Sun Fast Violet 23 pigment from Sun Chemical, and 118 grams 0.3 mm glass beads grinding media. The mixture was tumbled 3 hours at 57 rpm, then sieved and washed as in Example 3. Yield was 53.56 grams of a burnished medium violet powder with an emissivity of 0.45. The original material had an emissivity of 0.39.

It was discovered that the burnishing of silver-coated solid glass spheres does not require additional grinding media. The mass of the spheres is sufficient to provide the required energy to embed the pigment in the metal coating.

EXAMPLE 8

A total of 13,600 grams of silver-coated solid glass spheres manufactured by SDS, having an average particle size of 43 microns and a neat emissivity of 0.24 were placed in an Ultra-Vibe 45 manufactured by Tru Square Metal Products, Auburn, Wash., along with 360 grams of Ferro F-6331 black pigment. The spheres were burnished for three hours, removed, and sieved through a 150 micron screen. The resultant product was a dark gray-black, with a measured neat emissivity of 0.28.

EXAMPLE 9

A total of 1600 grams of silver-coated solid glass spheres manufactured by SDS (particle size 43 microns) was placed into an Ultra-Vibe 18 vibratory tumbler along with 10.8 grams Copper Phthalocyanine Blue pigment. The spheres were burnished for one hour. After sieving through a 150 micron screen, a yield of 1610.1 grams bright blue product was obtained. The neat emissivity of the silver-coated spheres was 0.28, with the burnished material sample measured as 0.30 neat.

The following example shows the ability to burnish metals other than silver without the use of additional grinding media.

EXAMPLE 10

The Ultra-Vibe 18 was charged with 1300 grams of 62 micron average particle size nickel-coated solid glass spheres manufactured by SDS, and 18 grams of Ferro F-6331 black pigment. The spheres were burnished for 12 hours. The resultant product was removed and sieved through a 150 micron screen. The yield was 1317.5 grams of burnished black material with an emissivity of 0.41, compared to the original material emissivity of 0.38.

The following five examples demonstrate the ability of the invention to impart visual color to a metal without significant impact on emissivity, regardless of the metal form.

PREPARATION OF INFRARED REFLECTIVE VISUALLY COLORED METAL PLATES

EXAMPLE 11

A 6"×6"×⅛" polished aluminum plate was burnished with F-6331 black pigment by placing a few grams of the pigment on the panel. The pigment was burnished by vigorous rubbing with a gloved thumb in a circular motion over the entire panel surface. Excess pigment was removed by wiping and the panel was washed with hot soapy water, rinsed and then wiped vigorously with a wet paper towel to remove any non-bonded pigment. The panel then was rinsed with water, followed by acetone, and dried with a paper towel. This procedure generated a dark gray-black surface with an emissivity of 0.26. The original aluminum panel had a measured emissivity of 0.10.

EXAMPLE 12

A procedure similar to Example 11 was utilized on a 2"×6"×1/16" polished copper panel. In this example, the copper panel was burnished using Copper Phthalocyanine Blue pigment. This resulted in a very dark blue surface having an emissivity of 0.04. The bright copper panel had a measured emissivity of 0.01 before burnishing with the pigment, demonstrating the exceptional performance of the invention in maintaining low emissivity while imparting visual color.

PREPARATION OF INFRARED REFLECTIVE VISUALLY COLORED METAL PARTICLES

EXAMPLE 13

A one quart can was charged with 122 grams of spherical copper powder (325 mesh from Alpha Aesar, Ward Hill, Mass.), 6.2 grams of Copper Phthalocyanine Blue pigment, and 93 grams of 0.3 mm glass beads grinding media. The mixture was tumbled for 3 hours at 57 rpm, and then sieved to remove the grinding media. The remaining material was placed in a 1 liter beaker and washed by decantation with 800 ml of acetone, followed by three washes of warm soapy water, then rinsed with clear water, and finally acetone. The washed material was then filtered and dried. This yielded a burnished dark blue black powder with an emissivity of 0.35. The original copper powder had an emissivity of 0.20.

EXAMPLE 14

A one quart can was charged with 71.7 grams of Chromium powder (100 mesh obtained from Alpha Aesar), 3.6 grams Copper Phthalocyanine Blue pigment, and 99.5 grams of 0.3 mm glass beads grinding media. This mixture was tumbled for 3 hours, sieved and washed as in Example 13. This yielded 73.9 grams of a burnished shiny metallic blue powder with an emissivity of 0.50. The original chromium powder had an emissivity of 0.35.

EXAMPLE 15

A one quart can was charged with 100 grams of Product Grade #S-892 5–60 micron aluminum spheres obtained from Reynolds Metals, 5 g of F-6331 Ferro black pigment, and 225.7 grams of 0.3 mm glass spheres grinding media. This mixture was tumbled for 1 hour at 57 rpm and the grinding media removed by sieving. The remaining material was washed as in Example 13 to yield 76.5 grams of a dark gray powder having an emissivity of 0.55. The original aluminum powder had an emissivity of 0.34.

PREPARATION OF INFRARED REFLECTIVE VISUALLY COLORED METAL COATED PARTICLE COMPOSITIONS AND THEIR APPLICATION

The following four examples demonstrate the performance of materials produced via the invention and incorporated into traditional coating systems for application to substrates.

EXAMPLE 16

An epoxy paint was formulated containing the following materials:

14.9 grams Ancamide 1767 (Air Products)
6.5 grams Ancarez 2364 (Air Products)
10 grams Epalloy 2230 (CVS Specialty Chemicals)
3 grams Epodil 748 (Air Products)
152.2 grams gray-black spheres from Example 8
20 grams solvent blend of 15% Toluene, 25% MPK, 25% MAK, and 35% n-butyl acetate A 10–12 mil film of this mixture was sprayed onto a urethane resin coated fabric using a manual siphon spray gun. The color of the applied film was dark gray to black with an emissivity of 0.35 as measured by the Inframetrics 760.

EXAMPLE 17

An epoxy paint was formulated containing the following materials:

14.9 grams Ancamide 1767 (Air Products)
6.5 grams Ancarez 2364 (Air Products)
10 grams Epalloy 2230 (CVS Specialty Chemicals)
3 grams Epodil 748 (Air Products)
152.2 grams black spheres from Example 10
20 grams solvent blend of 15% Toluene, 25% MPK, 25% MAK, and 35% n-butyl acetate A 10–12 mil film of this mixture was sprayed onto a urethane resin coated fabric using a manual siphon spray gun. The color of the applied film was dark gray to black with an emissivity of 0.41 as measured by the Inframetrics 760.

EXAMPLE 18

A urethane paint was formulated containing the following materials:

20 grams WCM600 (Air Products)
2.9 grams Ethacure 100 (Ethyl Corporation)
115 grams gray-black spheres described in Example 8
20 grams solvent blend of 80% MPK and 20% MAK A 10–12 mil film of this mixture was sprayed onto a 6" square primered aluminum panel using a manual siphon spray gun. The color of the applied film was dark gray to black with an emissivity of 0.35 as measured by the Inframetrics 760.

EXAMPLE 19

A urethane paint was formulated containing the following materials:

10.74 grams 631A-75 (Bayer Corp.)
2.95 grams 670A-80 (Bayer Corp.)
10.96 grams N-3390 (Bayer Corp.)
0.09 grams T12 Tin solution
0.28 grams Anti Terra U (BYK Chemie)
16.0 grams gray-black spheres described in Example 1
20 grams solvent blend 50% MEK and 50% MAK A 10–12 mil film of this coating was sprayed onto a 6" square primered aluminum panel using a manual siphon spray gun. The color of the applied film was dark gray to black with an emissivity of 0.40.

PREPARATION OF INFRARED REFLECTIVE VISUALLY COLORED SKIN CAMOUFLAGE PAINTS AND THEIR APPLICATION

The following example demonstrates the versatility of infrared pigments produced by the invention for use in skin camouflage applications. Use of a cosmetic-grade visual pigment allowed for the production of benign material for application to skin which embodied the benefits of the invention by providing strong visual color with a low emissivity coating. This resulted in masking the skin temperature such that it was indistinguishable from the background. No other materials currently available to the military or general public can produce this desired effect.

EXAMPLE 20

A solution was made from the following materials:
16 grams K-90 polyvinylpyrrolidone (BASF)
100 grams solvent blend of 75% isopropanol and 25% distilled water The polyvinylpyrrolidone/solvent mixture was applied to human skin and allowed to become tacky by evaporation of the solvent. Burnished gray-black cenospheres from Example 2 were applied to the tacky mixture with a cosmetic facial pad. The measured emissivity of the coated skin was 0.35, and appeared visually black. The emissivity of the skin before coating was 0.95.

What is claimed is:

1. An infrared reflective structure comprising a body having an outer metallic surface having an inherent emissivity of from about 0.01 to about 0.58, and visually colored pigment particles having a particle size of less than 1 micron embedded in said surface to yield a visually colored body having an emissivity of less than about 0.6.

2. The structure of claim 1 wherein said pigment articles have been mechanically forced into said metallic surface, and wherein said pigment particles are present at a level of from 0.0001% to 15% by weight of said body.

3. The structure of claim 1 wherein said body is comprised of particulate inorganic material selected from the group consisting of glass, ceramic, or metal, with dimensions between 1 and 500 microns and with an aspect ratio less than 10 to 1, and the configuration of said material being selected from the group consisting of hollow, porous, or solid bodies.

4. The structure of claim 3 dispersed in an organic or inorganic binder.

5. An infrared reflective, visually colored coating which comprises the bodies of claim 3 mixed with an organic or inorganic binder to form a coating on a substrate.

6. A structure of claim 3 modified with a thin overcoat of a nonconductive outer layer selected from the group consisting of water glass or an organic or inorganic binder and further modified by the inclusion in said outer layer of nonconducting particles to disrupt the conductivity of the metallic particles.

7. The structure of claim 1 comprising of a metallic sheet burnished with a visually colored pigment.

8. An infrared reflective structure according to claim 1 in which said metallic surface is comprised of one or more metals selected from the group consisting of silver, nickel, copper, iron, gold, palladium, platinum, cobalt, chromium, manganese, cadmium, tin, lead, antimony, tungsten, titanium, vanadium, zirconium, aluminum, molybdenum or zinc, or alloys containing one or more of these metals.

9. A fabric having a coating thereon containing a structure of claim 1 and imparting infrared reflective properties and visual color to said fabric.

10. A paint composition containing a structure of claim 1 and imparting infrared reflective properties and visual color to said paint and substrates coated therewith.

11. A laminate containing at least one layer that contains a structure as defined in claim 1.

12. An adhesive tape having on its nonadhesive side an infrared reflective structure according to claim 1.

13. A structure which absorbs electromagnetic radiation comprising an electrically conductive substrate, a radar absorbing layer overlying said substrate, and an infrared reflective layer overlying said radar absorbing layer, said infrared reflecting layer being comprised of a binder having dispersed therein a structure of claim 1.

14. A cosmetic preparation having infrared reflective properties and comprising binder material with benign skin contact properties and having dispersed therein one or a mixture of bodies comprised of an inorganic particulate material selected from the group consisting of glass, ceramic, or metal, with dimensions between 1 and 500 microns and with an aspect ratio less than 10 to 1, the configuration of said bodies being selected from the group consisting of hollow, porous, or solid, said bodies having outer metallic surfaces having inherent emissivities of from about 0.01 to about 0.58, and wherein visually colored particles having a particle size of less than 1 micron are embedded in said surfaces to yield a visually colored preparation having an emissivity of less than about 0.6 and benign skin contact properties, said preparation being suitable for infrared signature control as well as for visual camouflage.

* * * * *